US009416001B2

(12) United States Patent
Berenschot et al.

(10) Patent No.: US 9,416,001 B2
(45) Date of Patent: *Aug. 16, 2016

(54) METHOD FOR MAKING A 3D NANOSTRUCTURE HAVING A NANOSUBSTRUCTURE, AND AN INSULATING PYRAMID HAVING A METALLIC TIP, A PYRAMID HAVING NANO-APERTURES AND HORIZONTAL AND/OR VERTICAL NANOWIRES OBTAINABLE BY THIS METHOD

(71) Applicant: Universiteit Twente, Enschede (NL)

(72) Inventors: Johan Willem Berenschot, Winterswijk (NL); Niels Roelof Tas, Enschede (NL)

(73) Assignee: Universiteit Twente, Enschede (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/570,652

(22) Filed: Dec. 15, 2014

(65) Prior Publication Data
US 2015/0158724 A1 Jun. 11, 2015

Related U.S. Application Data

(63) Continuation of application No. 12/811,674, filed as application No. PCT/EP2008/011107 on Dec. 22, 2008, now Pat. No. 8,932,473.

(30) Foreign Application Priority Data

Jan. 6, 2008 (EP) .................................... 08000094

(51) Int. Cl.
*B81C 1/00* (2006.01)
*C03C 25/68* (2006.01)
(Continued)

(52) U.S. Cl.
CPC ............ *B81C 1/00111* (2013.01); *B82Y 35/00* (2013.01); *G01Q 70/10* (2013.01); *G01Q 70/16* (2013.01);
(Continued)

(58) Field of Classification Search
CPC .... B81C 1/00111; B82Y 35/00; G01Q 70/10; B33Y 10/00; B33Y 80/00
See application file for complete search history.

(56) References Cited

U.S. PATENT DOCUMENTS 5,483,118 A  1/1996  Nakamoto et al.
5,584,740 A  12/1996  Hsu et al.
(Continued)

FOREIGN PATENT DOCUMENTS

JP   6117849        4/1994
WO   WO03060923 A1  7/2003
WO   WO2004015362 A2 2/2004

OTHER PUBLICATIONS

Sarajlic et al., Fabrication of 3D nanowire frames by conventional micromachining technology, Solid-State Sensors, Actuators and Microsystems, 2005. Digest of Techn ICAI Papers. Transducers '05. The 13th Int. Conference on Seoul, Korea June 5-9, 2005, Piscataway, NJ, USA, IEEE, vol. 1, Jun. 5, 2005, pp. 27-30, XP010827954 ISBN: 978-0/7803-8994-6 cited in the application.

(Continued)

*Primary Examiner* — Duy Deo
(74) *Attorney, Agent, or Firm* — Bret E. Field; Makoto Tsunozaki; Bozicevic, Field & Francis LLP

(57) ABSTRACT

The invention relates to a method for making a 3D nanostructure having a nanosubstructure, comprising the steps of: i) providing a mold comprising at least one sharp concave corner; ii) conformational depositing at least one structural material in the sharp concave corner; iii) isotropically removing structural material; iv) depositing at least one other structural material; v) removing earlier deposited structural material; vi) forming a nanosubstructure; and vii) removing the mold thereby providing the 3D nanostructure having the nanosubstructure.

11 Claims, 16 Drawing Sheets

(51) Int. Cl.
*B82Y 35/00* (2011.01)
*G01Q 70/10* (2010.01)
*G01Q 70/16* (2010.01)
*B33Y 10/00* (2015.01)
*B33Y 80/00* (2015.01)

(52) U.S. Cl.
CPC *B33Y 10/00* (2014.12); *B33Y 80/00* (2014.12); *B81C 2201/034* (2013.01); *Y10T 428/2913* (2015.01); *Y10T 428/2982* (2015.01)

(56) References Cited

U.S. PATENT DOCUMENTS

| | | | |
|---|---|---|---|
| 5,769,679 | A | 6/1998 | Park et al. |
| 5,789,272 | A | 8/1998 | Wang et al. |
| 6,417,606 | B1 | 7/2002 | Nakamoto et al. |
| 6,924,158 | B2 | 8/2005 | Syms |
| 8,278,191 | B2 * | 10/2012 | Hildreth ............ B81C 1/00071 438/460 |
| 8,932,473 | B2 * | 1/2015 | Berenschot ......... B81C 1/00111 216/2 |
| 2003/0081651 | A1 | 5/2003 | Gianchandani et al. |
| 2010/0137523 | A1 * | 6/2010 | Mendoza ............... B82Y 30/00 525/327.1 |

OTHER PUBLICATIONS

Deladi et al., Fabrication of micromachined fountain pen with in situ characterization possibility of nanoscale surface modification; Fabrication of micromachined fountain pen with in situ characterization possibility of nanoscale surface modification', Journal of Micromechanics & Microengineering, Institute of Physics Publishing, Bristol, GB, vol. 15, No. 3, Mar. 1, 2005, pp. 528-534, XP0200914971SSN: 0960-1317.

* cited by examiner

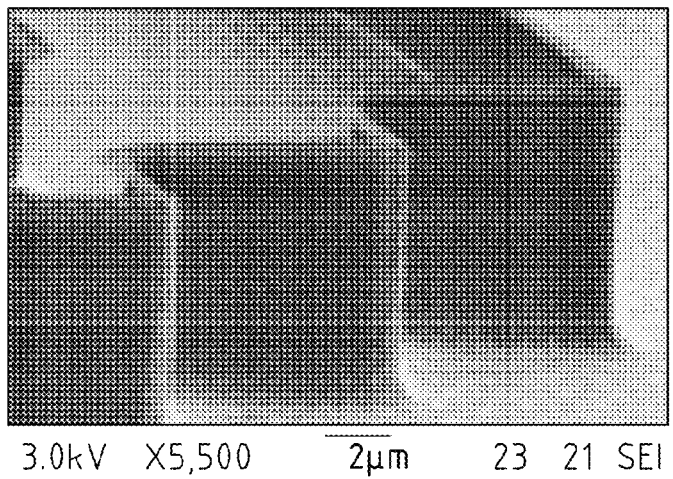
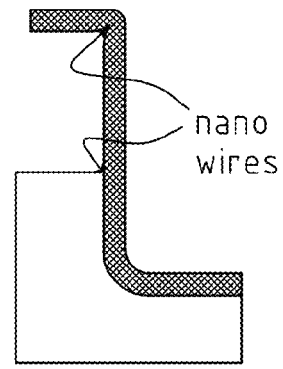
FIG. 8A FIG. 8B
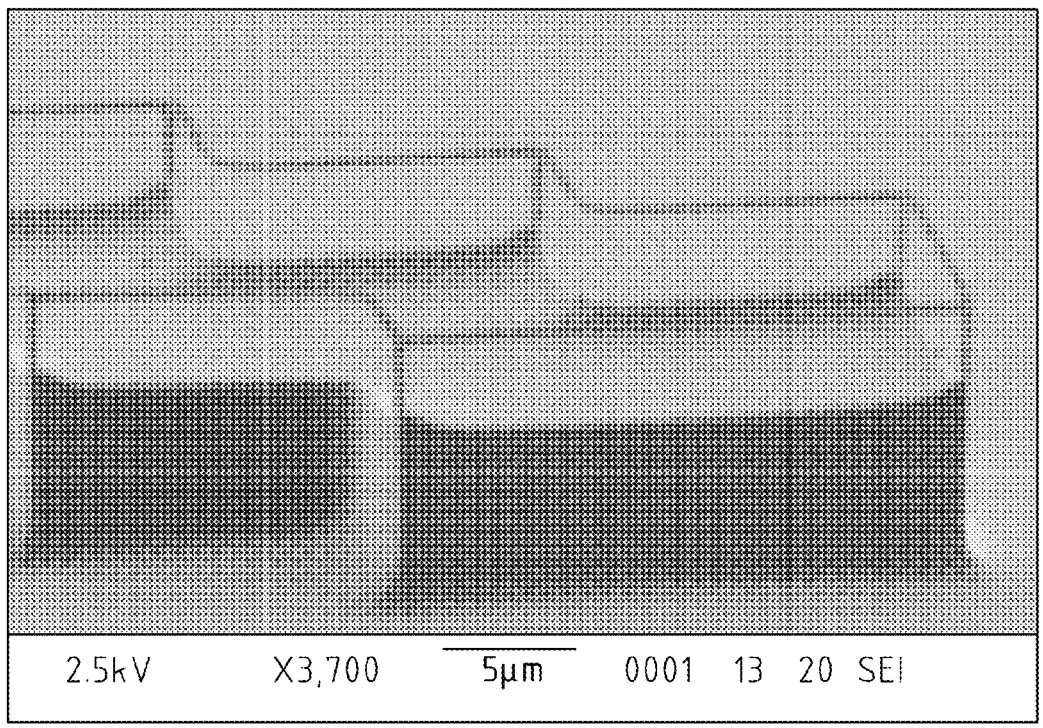
FIG. 9

METHOD FOR MAKING A 3D NANOSTRUCTURE HAVING A NANOSUBSTRUCTURE, AND AN INSULATING PYRAMID HAVING A METALLIC TIP, A PYRAMID HAVING NANO-APERTURES AND HORIZONTAL AND/OR VERTICAL NANOWIRES OBTAINABLE BY THIS METHOD

FIELD OF THE INVENTION

The present invention relates to a method for making a 3D nanostructure having a nanosubstructure and to particular 3D nanostructures having such nanosubstructure, such as an insulating pyramid having a metallic tip, a pyramid having nano-apertures and horizontal and/or vertical nanowires.

BACKGROUND

In nanotechnology the term "nano" means that the relevant dimension is less than 100 nm. This implies that the 3D nanostructure and substructures may be typically a few microns large, but would be much smaller. In this application the term "nano" also encompasses structure with a relevant dimension up to 100 microns, preferably up to 50 microns or up to 10 microns. The lower limit is about 1 nm, preferably about 5 or 10 nm.

Several fabrication strategies have been developed to define sub-micron features without the need for nano lithography. These include edge lithography to create 2D-confined nanochannels and nano-ridges (see N. R. Tas, J. W. Berenschot, P. Mela, H. V. Jansen, M. Elwenspoek, A. van den Berg, "2D-Confined Nanochannels Fabricated by Conventional Micromachining", Nano Lett., 2 (2002), pp. 1031-1032, and J. Haneveld, E. Berenschot, P. Maury, H. Jansen,"Nano-ridge fabrication by local oxidation of silicon edges with silicon nitride as a mask", J. Micromech. Microeng., 16 (2006), pp. S24-S28). Another fabrication strategy includes the use of stress induced retardation of oxide growth in corners to create nano-apertures (See A. Vollkopf, O. Rudow, M. Muller-Wiegand, G. Georgiev, E. Oesterschulze, "Influence of the oxidation temperature on the fabrication process of silicon dioxide aperture tips", Appl. Phys. A, 76 (2003), p. 923-926),and low temperature oxidation and selective etching (LOSE) to create an aperture at the apex of a pyramidal tip (see P. N. Minh, T. Ono, and M. Esashi, "Non-uniform silicon oxidation and application for the fabrication of aperture for near-field scanning optical microscopy", Appl. Phys. Lett., 75 (1999), pp. 4076-4078.

Corner lithography was introduced and used to create a nano wire pyramid (see E. Sarajlic, E. Berenschot, G. Krijnen, M. Elwenspoek, "Fabrication of 3D Nanowire Frames by Conventional Micromachining Technology", Transducers '05 [Digest of techn. Papers 13$^{th}$ Int. Conf. on Solid-State Sensors, Actuators and Microsystems], pp. 27-29).

Corner lithography is based on the material that is left in sharp concave corners after conformal deposition and isotropic etching. If t is the thickness of the deposited layer, α is the angle of the sharp concave corner, and R is the isotropic thinning distance, then the remaining material has a thickness w), given by:

$$w = \alpha - R = t/\sin(\alpha/2) - R$$

The remaining material in the corners is referred to in IC fabrication as "stringers" and is usually considered undesirable. In corner lithography they either constitute the structural material of wire structures and tips, or are used as a masking material in subsequent fabrication steps. The general fabrication method consists of a few basic steps: (1) mold fabrication, (2) conformal deposition of the structural material, (3) isotropic thinning of the structural layer, nanowires remain in sharp concave corners and (4) removal of the mold.

SUMMARY

The present invention has for its object to provide a method for making 3D nanostructures having at least one nanosubstructure and/or horizontal and/or vertical nanowires. The invention is based on the insight that by using corner lithography it is possible to create such nanosubstructures and nanowires without the need of nano lithography. To that extent structural material that remains after conformal deposition and subsequent isotropic thinning of a thin film in sharp concave corners is either used as a mask or directly as structural material. From the embodiments given it is clear that several steps can be added, for example to create an inversion mask. As will be shown the method according to the invention is a powerful technique for nano-patterning of pyramidal tips, as the ones used in scanning probe microscopy (SPM).

Furthermore, pyramids provided with apertures can be used for liquid meniscus manipulation. The 3D oriented wires can be used for manipulating a liquid droplet. In addition, due to the 3D orientation these nanowires can be used for advanced measurements whereas effects typical for nanowires can now be determined in a 3D mode. By appropriate selection of material 3D fluidum (gas/liquid) channels can be made (see for 2D fluidum channels: N. R. Tas, J. W. Berenschot, P. Mela, H. V. Jansen, M. Elwenspoek, A. van den Berg, "2D-Confined Nanochannels Fabricated by Conventional Micromachining", Nano Lett., 2 (2002), pp. 1031-1032.

Finally, provides a 3D coupling of nanowires (or nanochannels) a new combination of measured data in scanning probe microscopy.

Accordingly, in view of the above objectives and desires the present invention provides a method for making a 3D nanostructure having a nanosubstructure, comprising the steps of:

i) providing a mold comprising at least one sharp concave corner; ii) conformal depositing at least one structural material in at least the sharp concave corner; iii) isotropically removing structural material; iv) depositing at least one other structural material; v) removing earlier deposited structural material; vi) forming a nanosubstructure; and vii) removing the mold thereby providing the 3D nanostructure having the nanosubstructure.

A sharp concave corner has an angle which in principle is greater than 0° and less than 180°. More practically the angles lies between about 10° and about 170°. In practice for a silicon mold (made of silicon crystal) the crystal angles are at about 70°, 90° en 110°. Using other crystal structures for the mold will allow the use of different angles. In addition, an important (silicon) etching method for micromachining is the so called deep reactive ion etching (DRIE). DRIE etches substancially perpendicular to the (silicon) substrate. This implies that the angle will be in a range around 90°. Furhtermore, at angles close to 180° the differential overetching for selctively removing material will be more difficult. Thus, the angles could be within the range of 30° to 150°, such as 50° to 140°, or from 60° to 120°.

According to a preferred embodiment the 3D nanostructure has a pyramidal form and the conformal deposition takes place in at least the pyramidal apex and/or rigdes. However, other 3D structures such as cones and pyramids with a triangular or multigonal base, are also possible.

Different materials can be used as the structural material. Examples are polysilicon, silicon nitride and silicon oxide. Preferred are materials that can be conformally deposited using different methods and can be (isotropically) removed by different methods using conditions which are not negatively effecting the other applied materials. According to a preferred embodiment is in step iv) the other structural material deposited by local oxidation of the silicon mold and/or oxidation of a previously deposited structural material, such as poly silicon.

According to a preferred embodiment is structural material directly or after isotropical (partial) removal used for defining a space for the nanostructure. To that extent the step vi) of forming the nanosubstructure may comprise a further material deposition, such as metal, plastic, porous material or mixtures thereof. More preferably the metal deposition results in the formation of an insulating pyramid having a metallic tip. Such metallic tip can be used as catalyst for e.g. carbon nanotube (-nanofiber) growth,as a local electrode for electrical or electrochemical measurement +stimulus, or for surface enhanced raman spectroscopy (SERS) measurements.

In addition, the single hole at the apex can be used as a dopingmask. Mono crystalline silicon (or poly-Silicon) can be doped with boron. Accordingly, a boron doped p++ silicon nano-dot or line can be formed. Such structure conducts electricity well. Furthermore, this layer may be maintained when the mold is removed by etching. This results in the formation of a p++ nanodot or line. A metal contact can be provided to the top surface. When using this structure as a probe on a conductive surface it is possible to measure through the tip structure.

According to another embodiment are in step ii) two or more different structural materials are deposited, and preferably three different structural materials are deposited. This allows for the possibility of producing multi-layered nanostructures and/or nanostructures having multi-nanosubstructures. Under these conditions it is beneficial that the step vi) of forming the nanosubstructure comprises the timed removal of at least one of the two or more different structural material deposited in step ii). This allows for forming nanosubstructures having a shape or form that can be adjusted by the time of duration of the removal. Most preferred is the method wherein three different structural materials are deposited, and in step v) the first deposited structural material is isotropically removed. Accordingly, it is possible that the step vi) results in the formation of a pyramid having nano-apertures.

Such pyramid having nano-apertures may be used as a submold for subsequent metal deposition resulting in the formation of metal surfaces being part of the pyramid structure. Similar as for the apertures is the size and position relative to the tip of the metal apertures tunable.

According to another embodiment of the invention is provided a 3D nanostructure having a nanosubstructure in the form of a 3D oriented preferably horizontal and/or vertical nanowire, comprising the steps of: i) providing a mold comprising at least one horizontal and/or vertical sharp concave corner; ii) conformal depositing at least one structural material in at least the sharp concave corner iii) isotropically removing structural material thereby forming the horizontal and/or vertical nanowire. When desired it is possible to a nanosubstructure comprising both horizontal and vertical wires. In this respect it is possible to provide a suspended horizontal wire.

In relation to the materials it is noted that when using a sacrificial material (such as poly-silicon), circumvented by a structural material(such as an oxide or nitride) comprising two layers with in between the nanowire structure, it is possible in case of a pyramid structure and 3D oriented (vertical and/or horizontal) nanowire structure to create nanochannels in a 3D space.

Finally, another aspect of the invention relates to 3D nanostructures provided with the nanosubstructure, such as an insulating pyramid having a metallic tip, a pyramid having nano-apertures, and also horizontal and/or vertical nanowires.

Mentioned and other features of the method and 3D nanostructures according to the invention will be further illustrated by several embodiments which are given for information purposes only and are not intended to limit the invention to any extent. In relation to these embodiments reference will be made to the annexed figures of which:

BRIEF DESCRIPTION OF THE FIGURES

FIGS. 8A-B show a silicon oxide mold, note the overhanging "roof"; and FIG. 9 shows suspended silicon nitride nano wires created by corner lithography according to example 3.

FIG. 24A represents the top view of the final structure: a SiN pyramid fountain pen with tunable nano-apertures. Cross section 1-1 (24B) represents FIG. 23. FIGS. 24C and 24D show different cross sections.

DETAILED DESCRIPTION

The materials mostly used in the examples as structural or masking material are polysilicon (Low Pressure Chemical Vapour Deposited, LPCVD), silicon oxide (thermal), and low stress (silicon rich) silicon nitride (LPCVD). Table 1 summarizes the etch rates of these materials in the etchants used in the examples. TMAH refers to a 5 wt % solution of tetramethyl ammonium hydroxide in water at 70 ° C. 50% HF etching is performed at room temperature, without stirring. $H_3PO_4$ refers to a 85 vol % solution at 180° C.

TABLE 1

Etch rates in nm/min

| Etchant | Material | | |
|---|---|---|---|
| | Polysilicon | Silicon nitride | Silicon oxide |
| TMAH | 4-7e+02 * | 1e−02 | 7e−02 |
| HF 50% | 4e−02 | 3.3e+00 | 2e+03 |
| $H_3PO_4$ | 3e−01 | 4.3e+00 | 2.5e−01 |

* The lower value is for the lateral etch rate in confinement, specifically for the conditions presented below. The higher value is for the blank film.

EXAMPLE 1

Pyramid with Metal Nano-Tip

Figure 1:
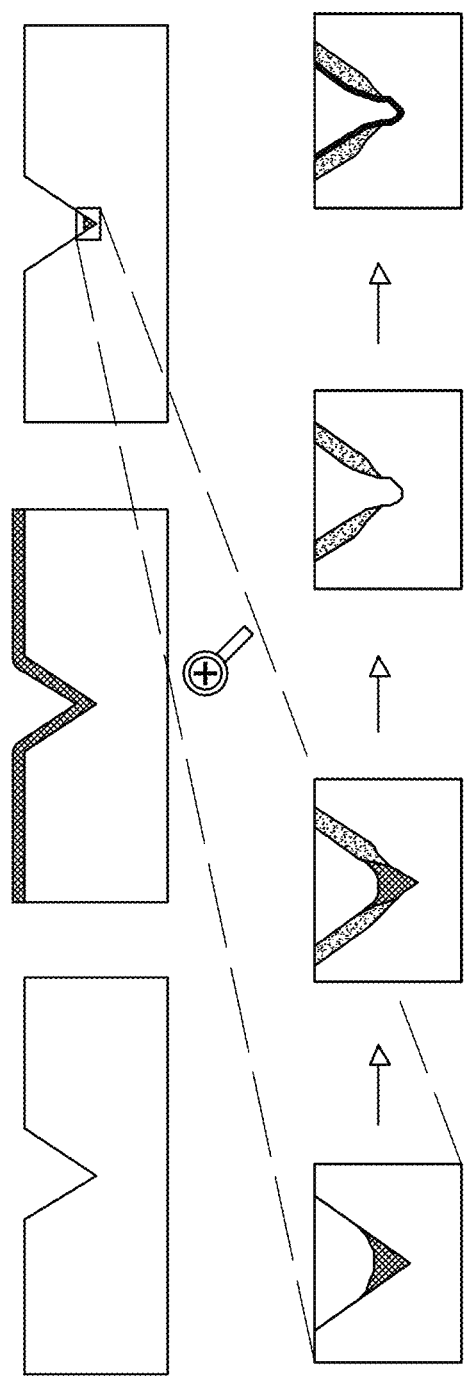
FIG. 1 shows a fabrication scheme for the silicon oxide pyramid containing a nanosubstructure in the form of a nanoscale metal tip.
Figure 2:
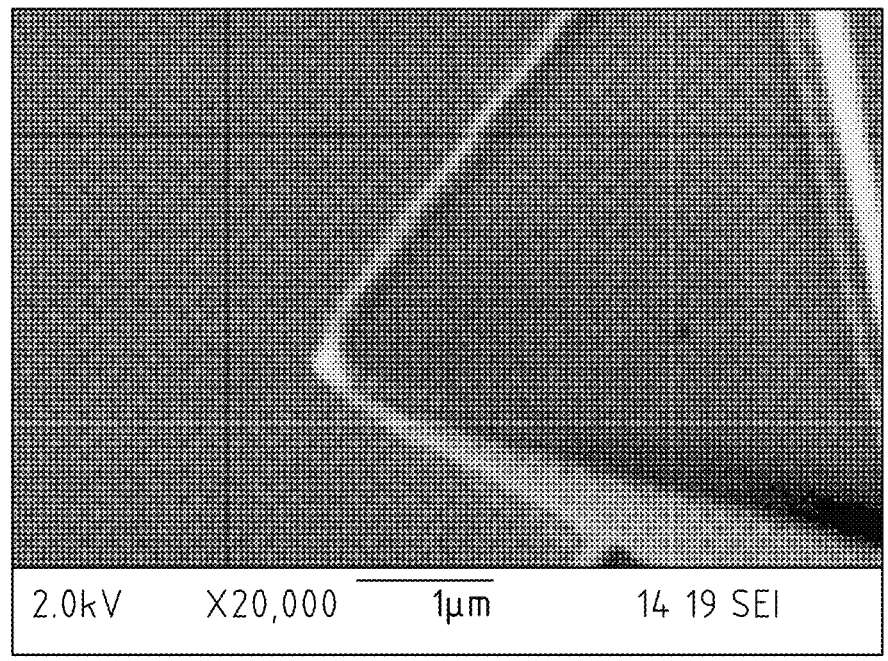
FIG. 2 shows a silicon oxide pyramid containing a chromium tip as produced in example 1.

The aim of this example is to create an insulating micro pyramid, with metallic tip. Ultimately this type of structure could find application in advanced SPM, for example for localized electrical or electrochemical measurements. FIG. 1 shows the fabrication scheme for an oxide pyramid supporting a nanosubstruture metal tip. Fabrication started with the mold fabrication, in this case by KOH etching in a <100> silicon wafer to create the pyramidal hole bounded by the <111> planes. Next, silicon nitride (220 nm) was deposited by LPCVD (conformal deposition) and isotropically removed in 50% HF (84 min. at room temperature). This is a timed etch step which required a 1.23 times over-etching to remove the silicon nitride in the four oblique ribs of the pyramidal hole (α=109.4°) and leaving only a small piece of silicon nitride at the tip. To calibrate the etching speed, a dummy wafer containing the same thickness of silicon nitride was etched in parallel. The silicon oxide structural material for the pyramid was formed by local oxidation of the silicon (LOCOS) (see J. A. Appels, E. Kooi, M. M. Paffen, J. J. H. Schatorje, W. Verkuylen, "Local oxidation of silicon and its applications in semiconductor-device technology", Philips Res. Rep., 25 (1970), pp. 118-132) using the residual silicon nitride as the inversion mask. The LOCOS step was a wet oxidation performed at 1000° C. for 35 min., resulting in a 270 nm layer. Next, the silicon nitride at the tip was removed in hot $H_3PO_4$ (30 min. at 180° C.) and 30 nm Chromium was deposited by sputtering to create the metal tip. Finally, the silicon mold was removed in TMAH. TMAH is a suitable etchant for this step as it has a high selectivity for silicon as compared to silicon oxide (table 1) [7]. FIG. 2 shows the fabricated silicon oxide pyramid having a Chromium tip of less than 300 nm in size.

Dependent on the material of the pyramide wires, the pyramid may have particular uses. With wires made of piezoresistive material, such as p++ silicon nano-dot or line, the pyramide may be used for measuring (contact) forces. With wires made material having a temperature dependent electrical resistance, a pyramide may be used for local temperature measurement. Wire dissipating electrical power may be used for local heating.

EXAMPLE 2

Pyramid with Nano-Apertures

Figure 3A:
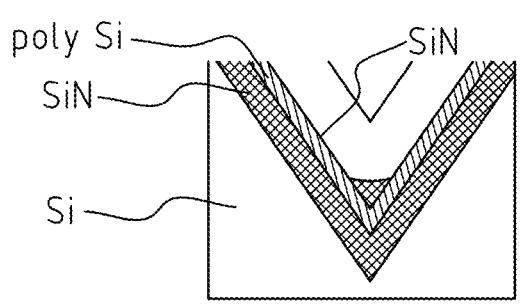
FIGS. 3A-3D are a visualization of the fabrication scheme for the silicon nitride pyramid with nano-apertures.
Figure 3B:
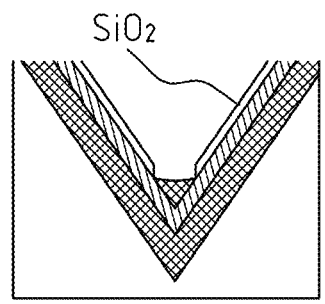
Figure 3C:
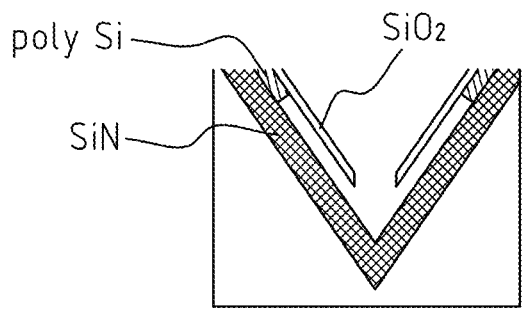
Figure 3D:
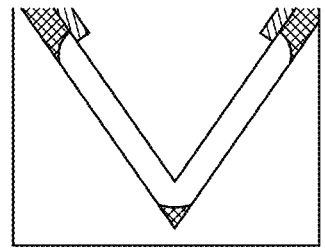
Figure 4:
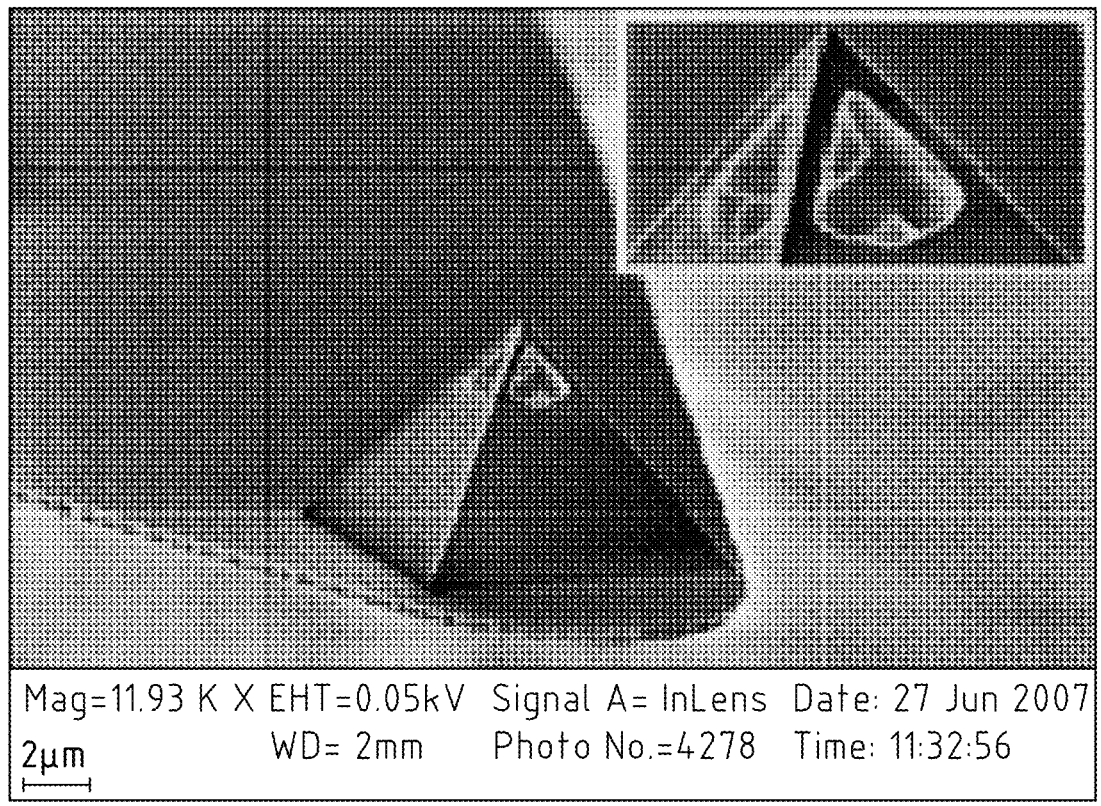
FIG. 4 shows silicon nitride pyramid with apertures in all four side walls as produced in example 2.

The aim of this example is to create a pyramid with tunable nanosubstructure apertures close to the tip. Fabrication started with KOH etching of the pyramidal mold in a <100> silicon wafer. Next, 500 nm LPCVD silicon nitride structural material was conformally deposited, followed by 330 nm LPCVD polysilicon. This layer acted as etching mask in later steps. A second layer of silicon nitride (120 nm) was deposited and isotropically etched in 50% HF in order to remove all of the silicon nitride but a small remnant at the tip (FIG. 3a). This remnant was used as an inversion mask in the LOCOS step (wet oxidation at 900° C. for 10 min.) of the polysilicon (FIG. 3b). After removal of the silicon nitride remnant a timed etching of the polysilicon followed, which starts at the apex of the pyramid and moves up along its sides (FIG. 3c). The duration of this step determines the height of the nano apertures to be formed. Typically, a confined layer of 330 nm polysilicon etches laterally at a speed of $4.2.10^2$ nm/min. in the 5 wt % TMAH solution supplied through a silicon oxide pinhole of sub 100 nm. Next the silicon oxide was removed and the first silicon nitride etched in 50% HF. This also is a timed etch step as it should leave the silicon nitride nano wires and the tip (FIG. 3d). FIG. 4 shows a typical fabrication result with apertures in the order of 1 μm in size. The size and the location of the apertures can be tuned by the thickness of in particular the silicon nitride layers and by the polysilicon etching time.

EXAMPLE 3

Nano Fencing: Suspended Nanowires

In this example vertical nanowires and suspended horizontal silicon nitride nanowires were created in the sharp concave corners of a silicon oxide mold. The suspended nanowires illustrate the ability to create relative long, slender and rather complex 3D-structures using corner lithography.

Figures 5A, 5B:
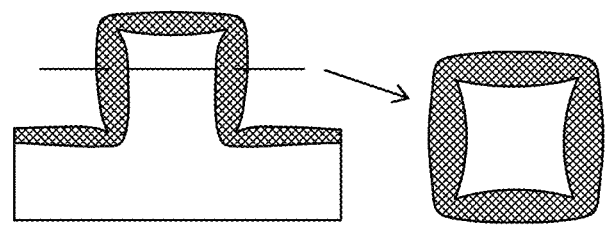
FIGS. 5A-5D show the mold fabrication for vertical nanowires. (5A) silicon pillar formation and oxidation. (5B) Cross section showing the corner sharpening. (5C) anisotropic silicon oxide etching. (5D) hollowing out of the mold structure.
Figures 5C, 5D:
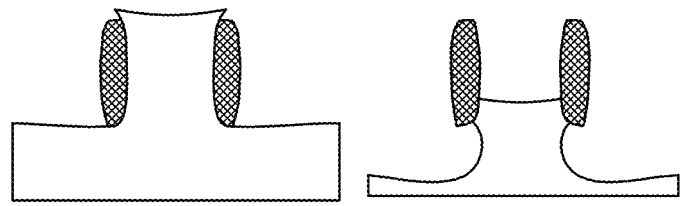
Figure 6A:
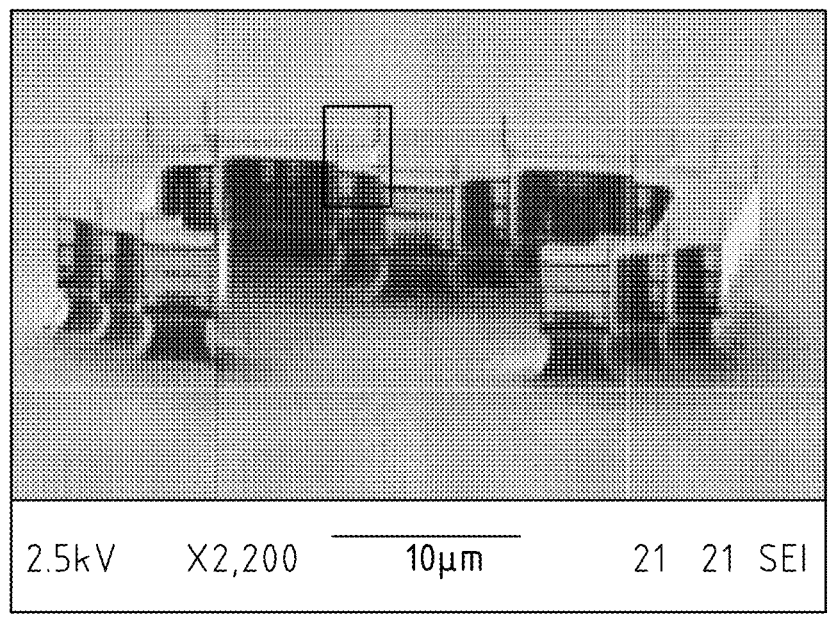
FIGS. 6A-B show (6A) a nanostructure containing vertical nanowires created through corner lithography. Note that wires have only been formed in the concave corners of the mold. (6B) Close up of some of the vertical nanowires as produced in example 3.
Figure 6B:
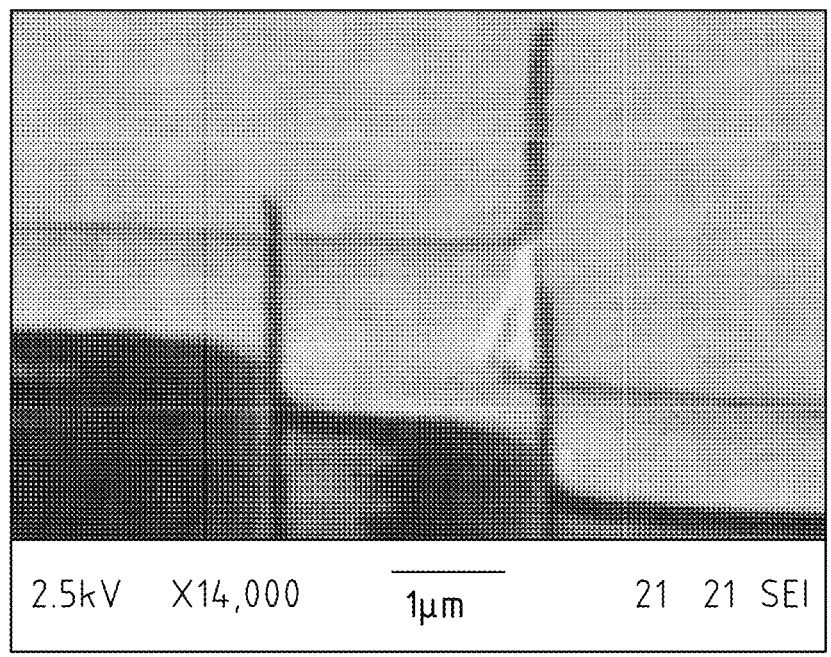
Figures 7A, 7B:
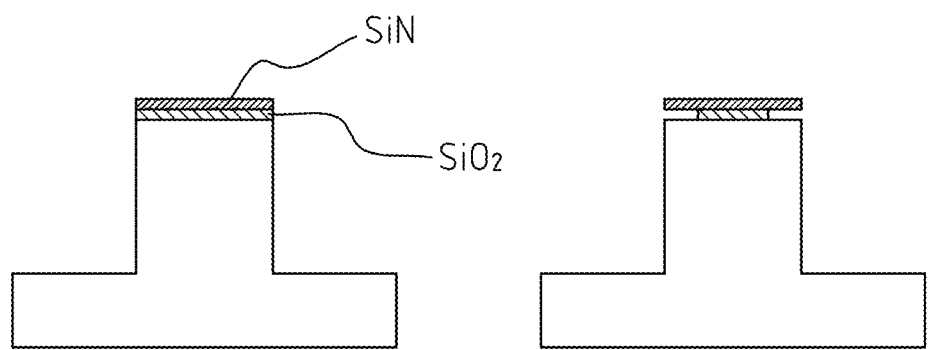
FIGS. 7A-D show the mold fabrication for horizontal nanowires suspended by vertical nanowires. (7A) Silicon etching. (7B) under cutting the silicon nitride mask layer. (7C) thinning down of the silicon nitride and subsequent LOCOS step. (7D) isotropic etching of the silicon to form the hollow mold structure.
Figures 7C, 7D:
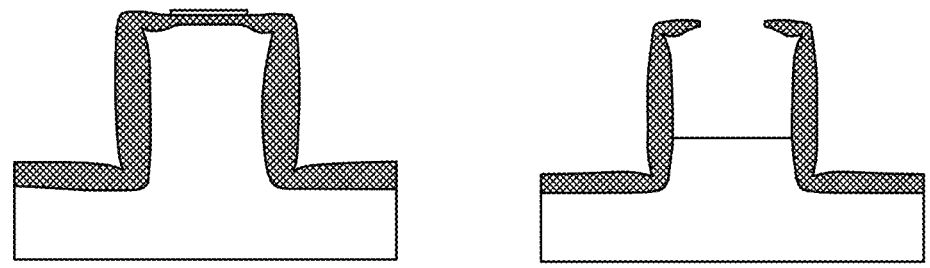

To create vertical nanowires a silicon oxide mold was made containing the appropriate sharp concave corners. Illustrated is the process which was followed by a structure having four vertical wires created in the corners of a square mold. First a square silicon pillar is etched by deep reactive ion etching (DRIE) with photoresist as the mask material. Next, the resist is stripped and the wafer oxidized (wet oxidation at 950° C.) to form the silicon oxide mold (thickness of about 400 nm), FIG. 5a. Under these conditions convex corners in the silicon are sharpened as is illustrate by the cross section, FIG. 5b (see R. B. Marcus, T. T. Sheng, "The oxidation of shaped silicon surfaces", *J. Electrochem. Soc.*, 129 (1982), pp. 1278-1282). Finally, the silicon oxide is removed from the top by a maskless directional RIE step (FIG. 5c), and the mold is hollowed out by isotropic RIE in a $SF_6$ plasma (FIG. 5d). This completes the mold fabrication. To create vertical wires a silicon nitride layer of 350 nm was deposited by LPCVD and etched back in hot $H_3PO_4$ for 83 min to leave the wires in the concave corners. Finally, the silicon oxide mould was removed in BHF and the vertical nanowires remained (FIGS. 6A to 6B). Note that vertical nanowires are only formed in concave corners of the mold, therefore they are situated only at convex corners of the supporting structure after removal of the mold.

To add suspended horizontal nanowires an overhanging "roof" is added to the mold to create an horizontally oriented concave corner. The fabrication of the mold is illustrated in FIGS. 7A to 7D. First a silicon pillar is etched by DRIE (Bosch process) using a silicon oxide and silicon nitride bi-layer as the mask. Next, the silicon oxide is etched in BHF, under-cutting the silicon nitride thin film. Then the silicon nitride is thinned down in hot $H_3PO_4$ until it is only left on top of the silicon oxide. Using the remaining mask material a LOCOS step is performed. After stripping of the silicon nitride and thinning down of the silicon oxide, the silicon is isotropically etched in a $SF_6$ plasma through the window in the silicon oxide. FIG. 8A shows a SEM picture of a typical mold structure. The cross section next to it shows the location of the horizontal nanowires in the concave corners of the mold. FIG. 9 shows the resulting suspended nano wire structure formed after conformal deposition of silicon nitride (350 nm by LPCVD), subsequent isotropic thinning of this layer in hot $H_3PO_4$ for 83 min., and removal of the mold in BHF.

EXAMPLE 4

Method for Making a Silicon Nitride (SiN) Pyramid Fountain-Pen with Tunable Nano-Apertures.

As in example 2 is first produced a SiN pyramid with tunable nano-apertures. Subsequently, by further two conformal depositions of structural materials and by sacrificial etching of the formerly deposited structural layer are formed channels for liquid or gas. Finally after removal of the the silicon mold, remains a free hanging inverted pyramid containing a fluid/gas supply channel with nano-apertures.

With reference to the FIGS. 10-24 the method for making a silicon nitride pyramid fountain-pen is further described.

Figure 10:
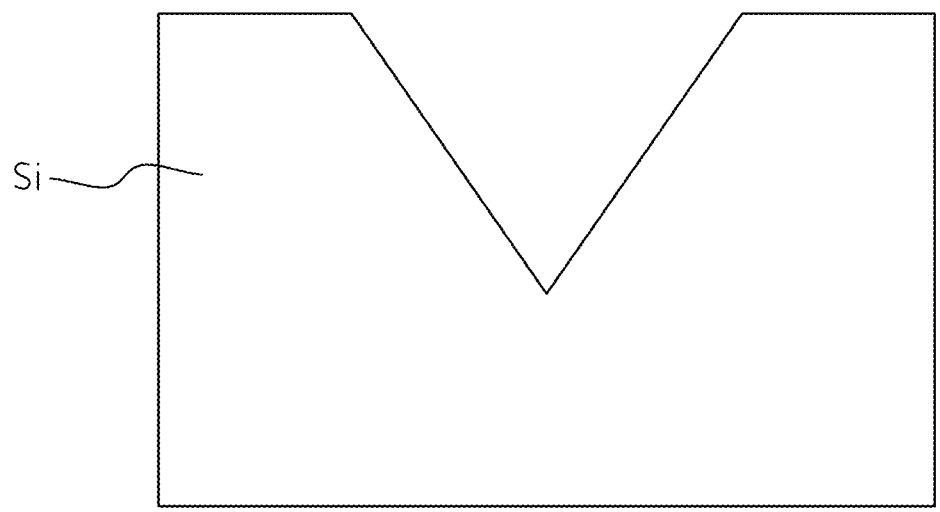
FIG. 10: Mold fabrication: inverted pyramid in mono crystalline silicon created by anisotropic wet etching.

FIG. 10: Mold fabrication: inverted pyramid in mono crystalline silicon created by anisotropic wet etching.

Figure 11:
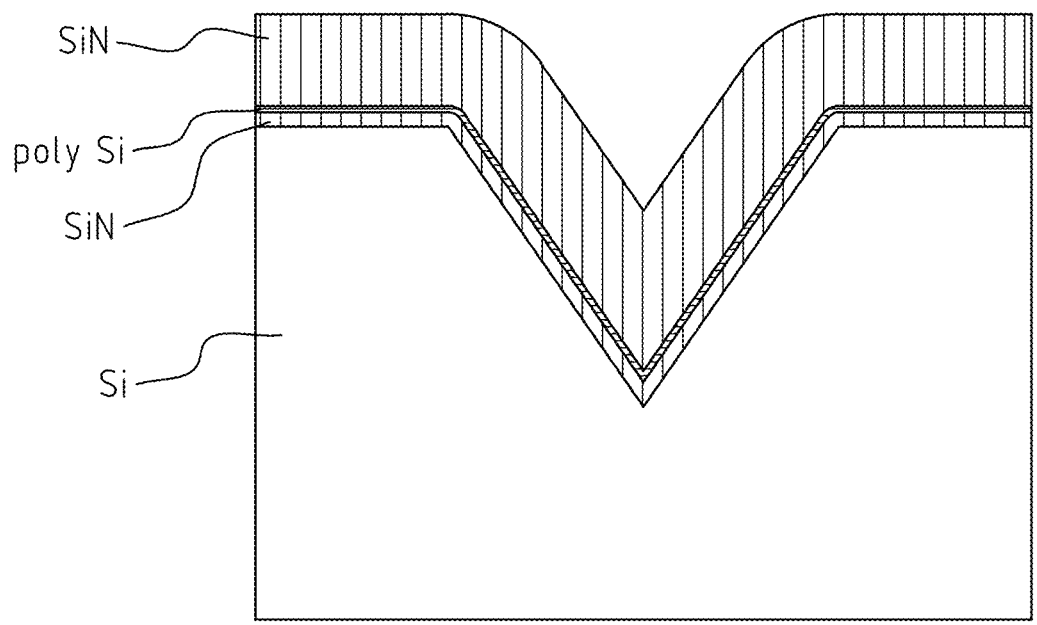
FIG. 11 shows the conformal deposition of 3 layers: LPCVD SiN, LPCVD Poly-Si, LPCVD SiN.

FIG. 11 shows the conformal deposition of 3 layers: LPCVD SiN, LPCVD Poly-Si, LPCVD SiN.

Figure 12:
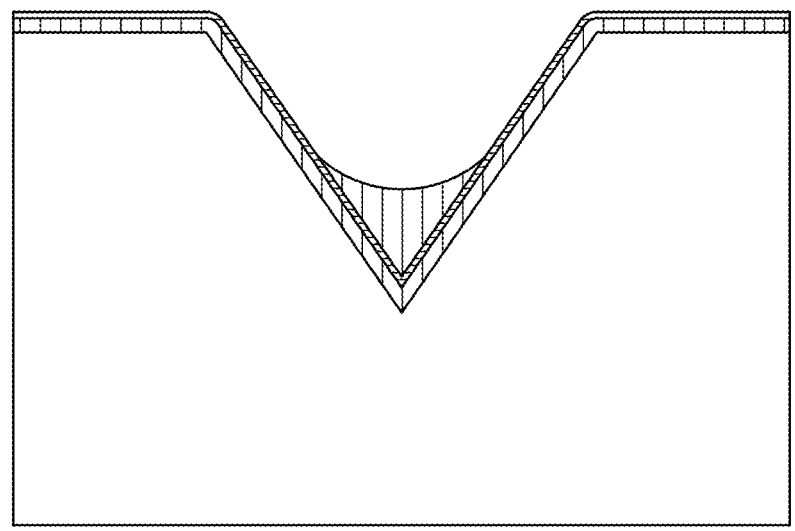
FIG. 12 shows the isotropic removal of the last deposited LPCVD SiN layer.

FIG. 12 shows the isotropic removal of the last deposited LPCVD SiN layer.

Figure 13:
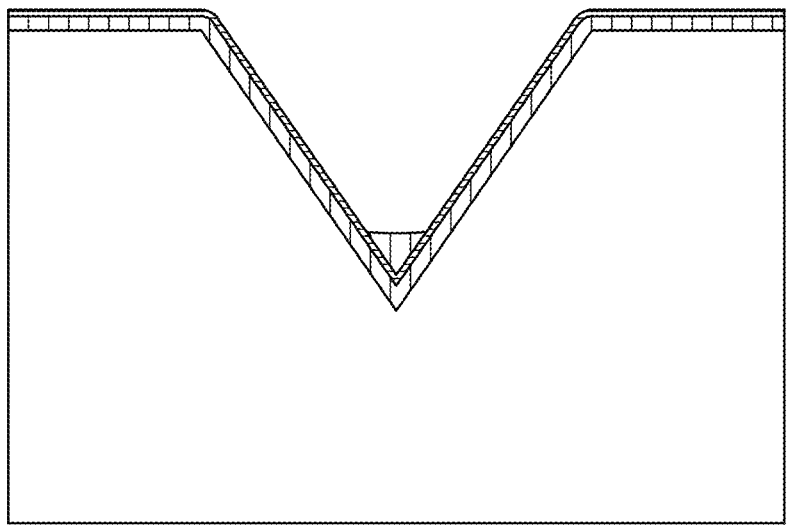
FIG. 13 shows the 1.23 times over-etching to remove the LPCVD SiN in the four oblique ribs of the inverted pyramid.

FIG. 13 shows the 1.23 times over-etching to remove the LPCVD SiN in the four oblique ribs of the inverted pyramid.

Figure 14:
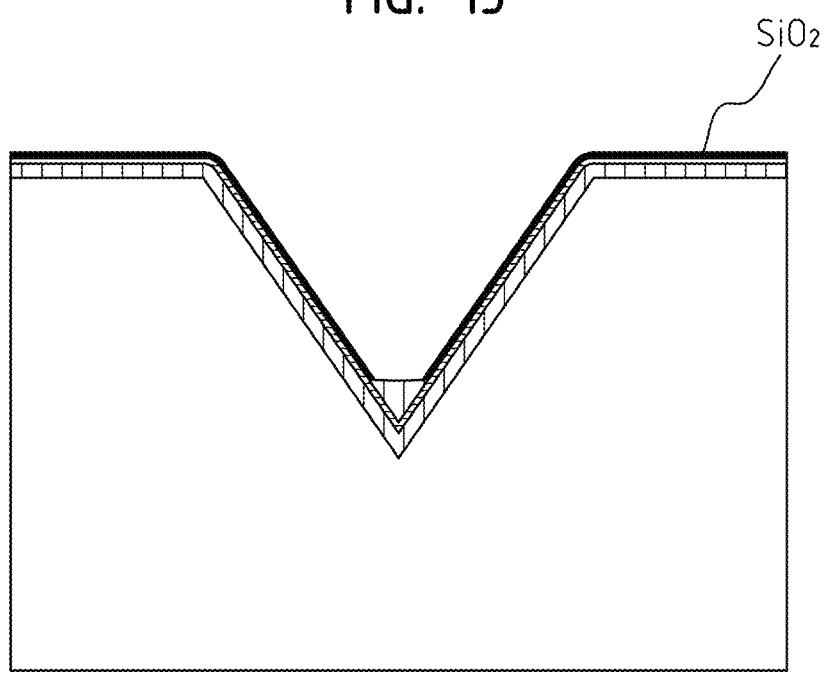
FIG. 14 shows the partly oxidation of the LPCVD poly-Si using the residual LPCVD SiN as inversion mask. (local oxidation of LPCVD poly-Si: LOCOS)

FIG. 14 shows the partly oxidation of the LPCVD poly-Si using the residual LPCVD SiN as inversion mask. (local oxidation of LPCVD poly-Si: LOCOS).

Figure 15:
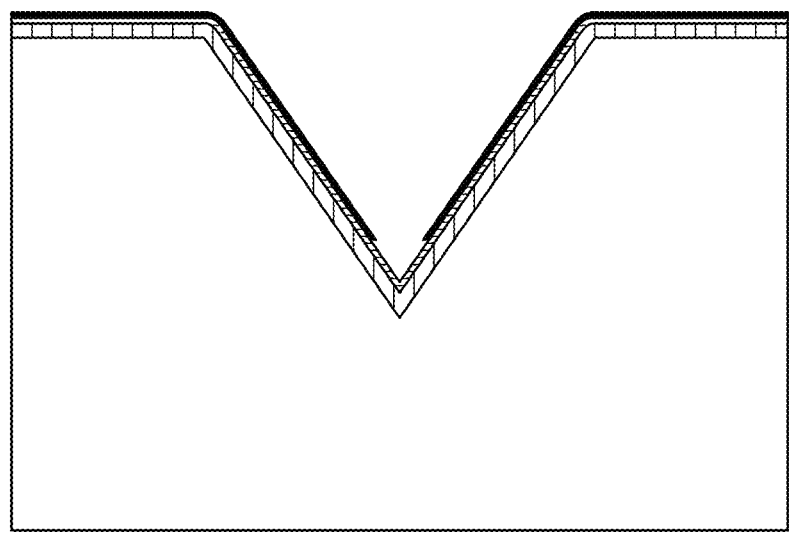
FIG. 15 shows the stripping of the residual LPCVD SiN.

FIG. 15 shows the stripping of the residual LPCVD SiN.

Figure 16:
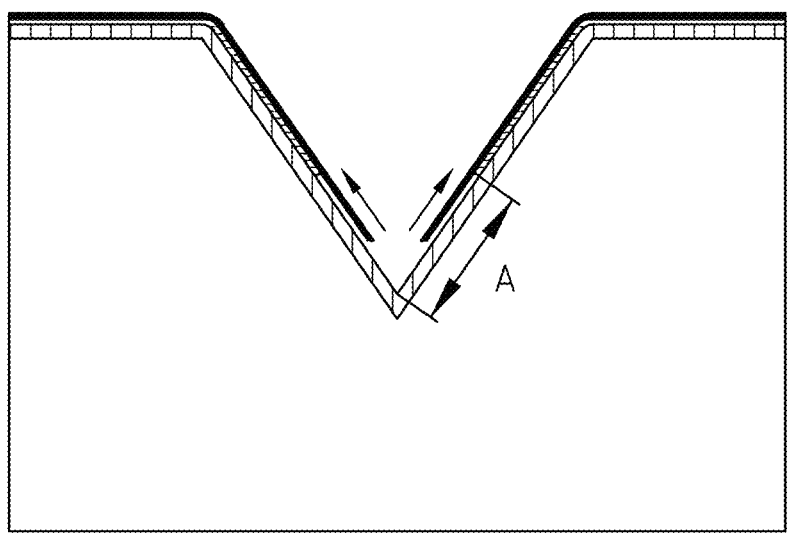
FIGS. 16 shows the wet etching of poly-Si using the LOCOS-oxide as mask material. length A can be tuned by the etching time.

FIGS. 16 shows the wet etching of poly-Si using the LOCOS-oxide as mask material. Length A can be tuned by the etching time.

Figure 17:
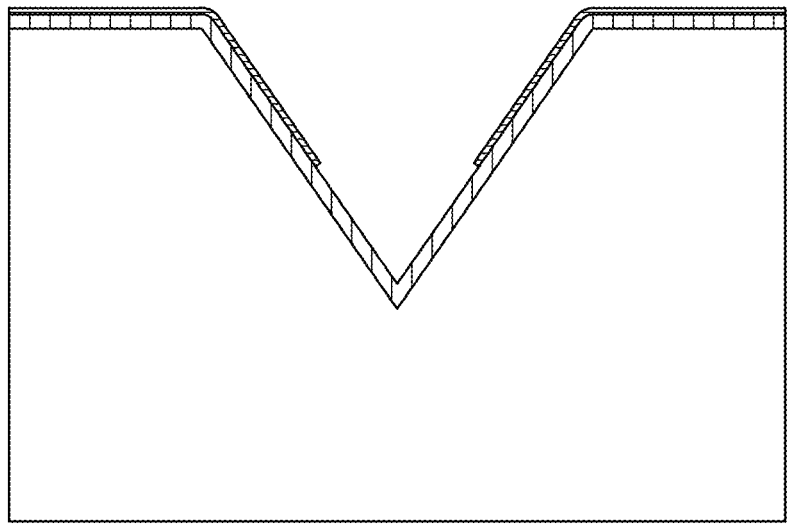
FIG. 17 shows the stripping of the LOCOS oxide.

FIG. 17 shows the stripping of the LOCOS oxide.

Figure 18:
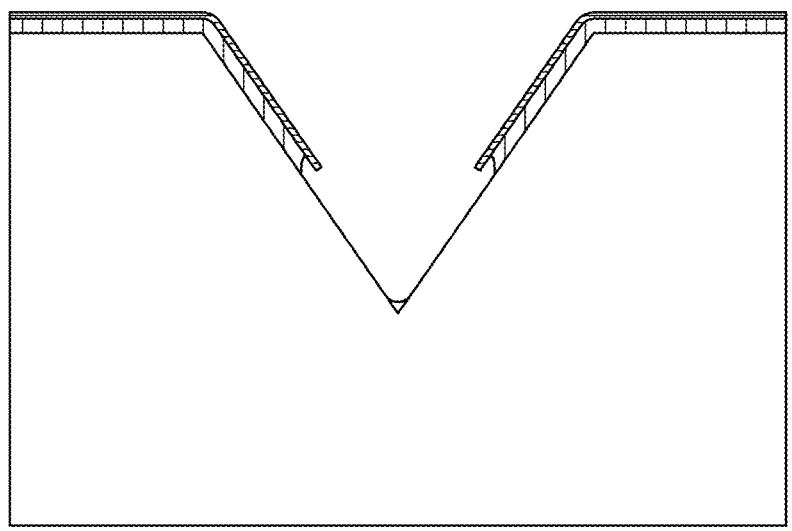
FIG. 18 shows the isotropic etching of the first deposited LPCVD SiN layer using the polysilicon as the etch mask.

FIG. 18 shows the isotropic etching of the first deposited LPCVD SiN layer using the polysilicon as the etch mask.

Figure 19:
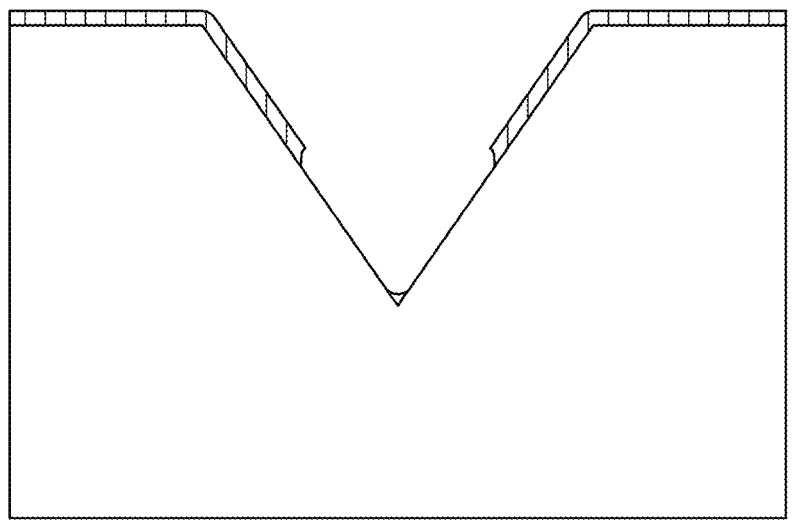
FIG. 19 shows the stripping of the poly-silicon layer.

FIG. 19 shows the stripping of the poly-silicon layer.

Figure 20:
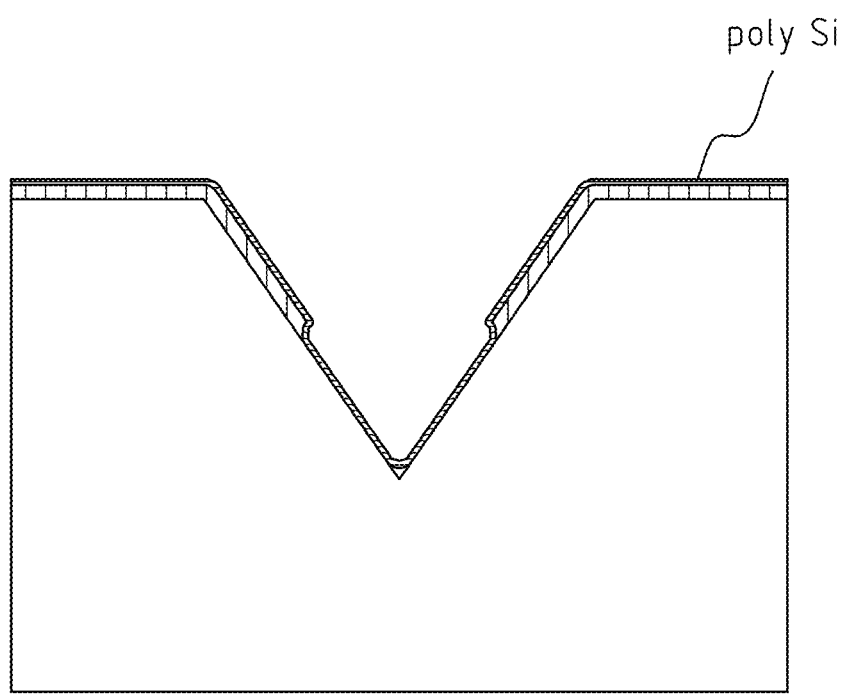
FIG. 20 shows the conformal deposition of LPCVD poly Si (sacrificial layer)

FIG. 20 shows the conformal deposition of LPCVD poly Si (sacrificial layer).

Figure 21:
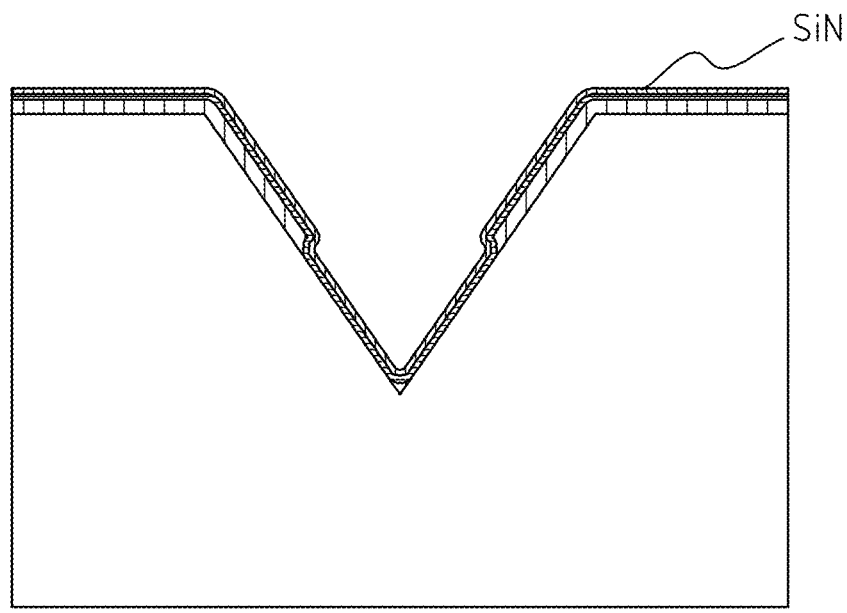
FIG. 21 shows the conformal deposition of LPCVD SiN (capping layer of the fluid/gas channel)

FIG. 21 shows the conformal deposition of LPCVD SiN (capping layer of the fluid/gas channel).

Figure 22:
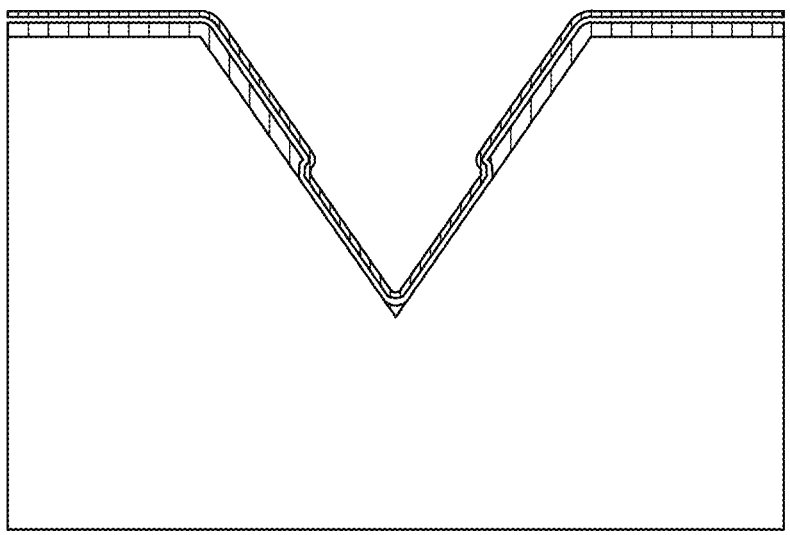
FIG. 22 shows the sacrificial etching of the LPCVD poly-Si layer, leaving a channel for fluid/gas supply.

FIG. 22 shows the sacrificial etching of the LPCVD poly-Si layer, leaving a channel for fluid/gas supply.

Figure 23:
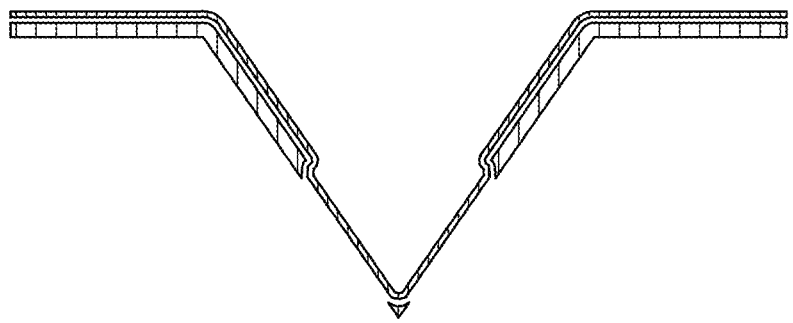
FIG. 23 shows the removal of the silicon mold, leaving a free hanging inverted pyramid containing a fluid/gas supply channel with nano-apertures.
Figure 24A:
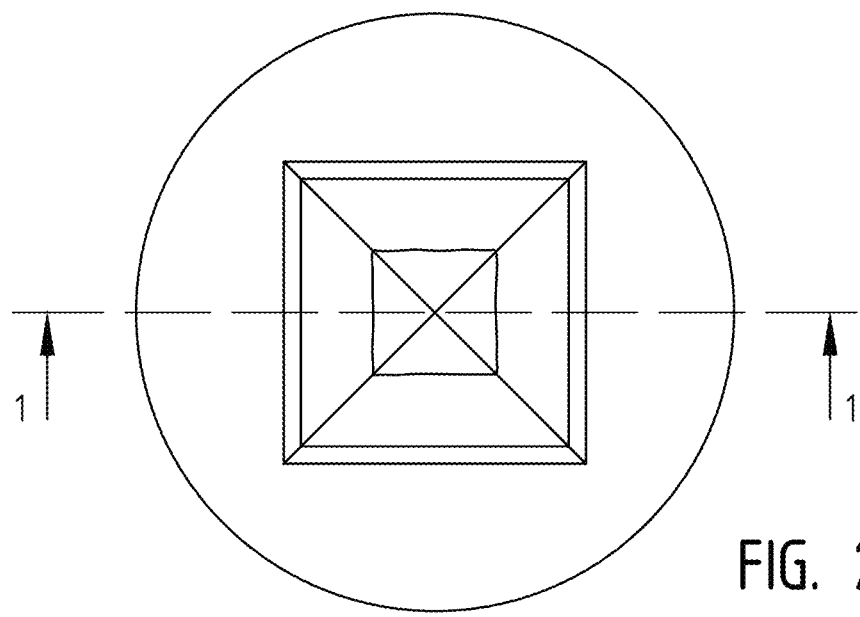
FIGS. 24A-D.
Figure 24B:
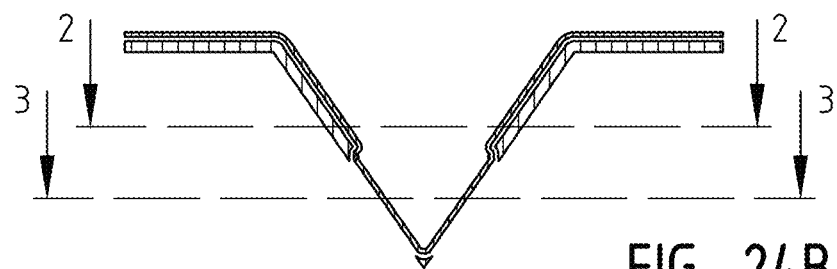
Figure 24C:
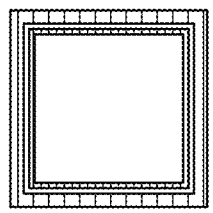
Figure 24D:
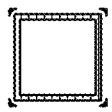

FIG. 23 shows the removal of the silicon mold, leaving a free hanging inverted pyramid containing a fluid/gas supply channel with nano-apertures.

FIGS. 24A-24D is the top drawing represents the top view of the final structure: a SiN pyramid fountain pen with tunable nano-apertures. Cross section 1-1 represents FIG. 23. Views 2) and 3) show different cross sections.

Figures 25A, 25B:
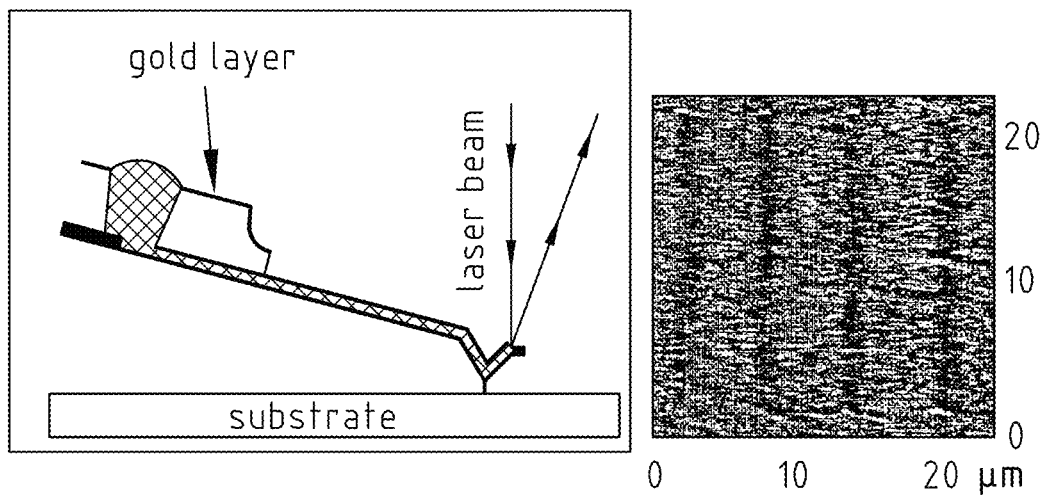
FIGS. 25A-B. (25A) Cross section of a prior art nano fountain pen. The liquid is transported from the reservoir to the pyramidal tip through the embedded nanochannel. (25B) Written line pattern of a self-assembled monolayer (ODT) on sputtered gold. The typical line width is 1 μm.
Figure 26:
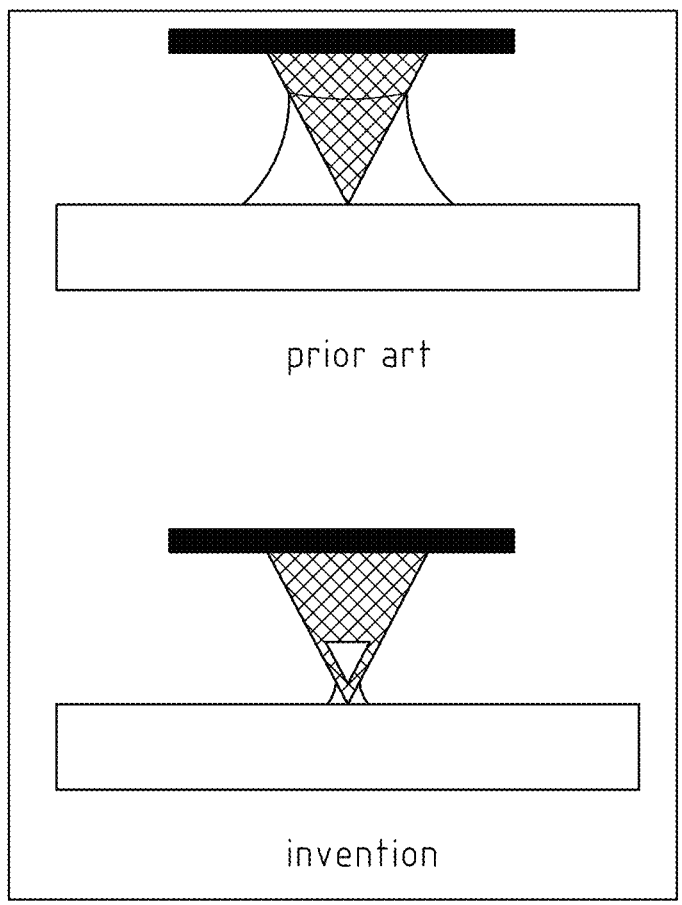
FIG. 26. (Left) In a locally "wet" environment a relative large meniscus (pm size) can be formed around the tip. (Right) It is expected that the apertures in the sides of the pyramid will help to confine the meniscus to the tip apex.

The advantage of the fountain pen approach compared with NADIS (nanoscale dispensing system) is that a wider variety of inks can be used (also more volatile ones) and that eventually complex fluidic delivery systems can be made. Compared with the popular dip pen technology some of the possible advantages of the fountain pen technology are: a larger amount of ink is available, the dependence of the writing process on relative humidity could be less, inks can be mixed at the tip, inks can possibly be changed during writing and electrochemical deposition of for example metals is possible. A cross-section of the prior art probe is shown in FIG. 25A below, together with a written line pattern of a self-assembled monolayer (ODT) on gold. As can be seen in FIG. 25A, the written feature size is still in the order of 1 μm. The explanation for this is that most likely a local "wet" environment is created in the vicinity of the tip which, as described by the Kelvin equation, leads to a meniscus with a relative large radius of curvature. Depending on the contact angle of the ink to the substrate and the tip material, this can easily lead to a rather large spot on the substrate (FIG. 26 (left) illustrates this). The strategy that we will follow to confine the meniscus is the use of the apertures on the four sides of the pyramid. It is expected that the meniscus is confined to the tip apex as illustrated in FIG. 26. Liquid is supplied through the inside of the pyramid. A second approach is to guide the liquid in or along the wires of a wire pyramid structure. The final aim in the scope of this proposal is a ten-fold reduction of the line width, so typically sub-100 nm resolution. The applicant has ongoing collaborations with the Biophysical Engineering Group of prof. Subramaniam and the Molecular Nanofabrication group of prof. Huskens (both at the university of Twente) on the application of the nanofountain pen, therefore knowledge of different inks and substrates to be tested is available to the project.

In the above examples has been shown a fabrication process for 3D nanostructures comprising nanosubstructures without the need for nano lithography. The method according to the invention is also capable of creating nanowires (vertical as well as suspended horizontal) and has been shown effective for modifications of pyramidal tips, as the ones used in scanning probe microscopy. As it is a batch-wise process which is relative cheap.

The invention claimed is:

1. A method for making a 3D nanostructure having a nanosubstructure, comprising the steps of:
   i) providing a mold comprising at least one sharp concave corner;
   ii) conformal depositing at least one structural material in at least the sharp concave corner;
   iii) isotropically removing at least a portion of one or more of the at least one structural material;
   iv) depositing at least one other structural material after step iii);
   v) removing at least a portion of one or more earlier deposited structural material after step iv);
   vi) forming a nanosubstructure; and
   vii) removing the mold thereby providing the 3D nanostructure having the nanosubstructure.

2. The method according to claim 1, wherein the mold is a pyramidal mold.

3. The method according to claim 1, wherein in step iv) the other structural material is deposited by local oxidation of the silicon mold and/or oxidation of a previously deposited structural material, such as poly silicon.

4. The method according to claim 1, wherein the step vi) of forming the nanosubstructure comprises deposition of a further material, such as a metal, plastic, porous material or mixtures thereof.

5. The method according to claim 4, wherein the material deposition results in the formation of an insulating pyramid having a metallic tip.

6. The method according to claim 1, wherein in step ii) two or more different structural materials are deposited, and preferably three different structural materials are deposited.

7. The method according to claim 6, wherein the step vi) of forming the nanosubstructure comprises the timed removal of at least one of the two or more different structural material deposited in step ii).

8. The method according to claim 6, wherein three different structural materials are deposited, and in step v) the first deposited structural material is removed by isotropical etching.

9. The method according to claim 7, wherein step vi) results in the formation of a pyramid having nano-apertures.

10. The method according to claim 9 wherein the nano-apertures function as a mask, such as for metal deposition.

11. The method according to claim 7, wherein the step vi) of forming the nanosubstructure further comprises, after the timed removal:
    depositing a sacrificial material over the first deposited structural material;
    depositing a capping layer over the sacrificial material; and
    removing the sacrificial layer,
    thereby forming a nanochannel in 3D space.

* * * * *